United States Patent
Espiritu et al.

(10) Patent No.: US 12,302,657 B2
(45) Date of Patent: May 13, 2025

(54) SEMICONDUCTOR DEVICE AND METHOD OF FORMING AN OPTICAL SEMICONDUCTOR PACKAGE WITH A SHIELD STRUCTURE

(71) Applicant: UTAC Headquarters Pte. Ltd., Singapore (SG)

(72) Inventors: Emmanuel Espiritu, Singapore (SG); Il Kwon Shim, Singapore (SG); Jeffrey Punzalan, Singapore (SG); Teddy Joaquin Carreon, Singapore (SG)

(73) Assignee: UTAC Headquarters Pte. Ltd., Singapore (SG)

( * ) Notice: Subject to any disclaimer, the term of this patent is extended or adjusted under 35 U.S.C. 154(b) by 444 days.

(21) Appl. No.: 17/664,510

(22) Filed: May 23, 2022

(65) Prior Publication Data
US 2022/0384505 A1     Dec. 1, 2022

Related U.S. Application Data

(60) Provisional application No. 63/194,375, filed on May 28, 2021.

(51) Int. Cl.
*H01L 27/146*     (2006.01)
*H01L 23/31*      (2006.01)
*H10F 39/00*      (2025.01)

(52) U.S. Cl.
CPC ..... *H10F 39/8057* (2025.01); *H01L 23/3157* (2013.01); *H10F 39/011* (2025.01);
(Continued)

(58) Field of Classification Search
CPC . H01L 23/31; H01L 23/3107; H01L 23/3114; H01L 23/3121; H01L 23/3142; H01L 23/315; H01L 23/3157; H01L 23/3171; H01L 23/3185; H01L 27/14; H01L 27/144; H01L 27/146; H01L 27/14601; H01L 27/14618; H01L 27/1462; H01L 27/14623; H01L 27/14625; H01L 27/14627; H01L 27/14634; H01L 27/14636; H01L 27/14683; H01L 27/14685; H01L 27/1469; H10F 39/26; H10F 39/011; H10F 39/811;
(Continued)

(56) References Cited

U.S. PATENT DOCUMENTS 8,722,449 B2 *  5/2014  Wada ............... H01L 27/14683
                                                257/E31.127
8,847,146 B2    9/2014  Tu et al.
(Continued)

*Primary Examiner* — John R Lee
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate. A semiconductor die including a photosensitive circuit is disposed over the substrate. A shield is disposed over the substrate and semiconductor die with a first opening of the shield disposed over the photosensitive circuit. An outer section of the shield is attached to the substrate and includes a second opening. An encapsulant is deposited over the substrate and semiconductor die. The encapsulant extends into the first opening and a first area between the shield and substrate while a second area over the photosensitive circuit remains devoid of the encapsulant.

20 Claims, 9 Drawing Sheets

(52) U.S. Cl.
CPC ....... *H10F 39/804* (2025.01); *H10F 39/8063* (2025.01); *H10F 39/811* (2025.01)

(58) Field of Classification Search
CPC .. H10F 39/8063; H10F 39/806; H10F 39/804; H10F 39/805; H10F 39/8057
See application file for complete search history.

(56) References Cited

U.S. PATENT DOCUMENTS

| | | | |
|---|---|---|---|
| 10,790,244 B2* | 9/2020 | Huang | H01L 24/19 |
| 11,403,870 B2* | 8/2022 | Liu | G06V 40/1329 |
| 11,614,606 B2* | 3/2023 | Komai | H01L 27/14625 |
| | | | 348/340 |
| 11,848,288 B2* | 12/2023 | Huang | H01L 25/105 |
| 2009/0045476 A1* | 2/2009 | Peng | H01L 27/14683 |
| | | | 257/E31.127 |
| 2011/0156188 A1* | 6/2011 | Tu | H01L 27/14623 |
| | | | 257/E31.127 |
| 2019/0035706 A1* | 1/2019 | Watanabe | H01L 23/3171 |
| 2020/0006259 A1* | 1/2020 | Huang | H01F 27/2804 |
| 2020/0012081 A1* | 1/2020 | Komai | G02B 13/0085 |
| 2020/0051882 A1* | 2/2020 | Watanabe | H01L 21/568 |
| 2022/0013421 A1* | 1/2022 | Watanabe | H01L 21/568 |
| 2022/0068991 A1* | 3/2022 | Tanaka | H01L 27/14623 |
| 2022/0384505 A1* | 12/2022 | Espiritu | H01L 27/14627 |

* cited by examiner

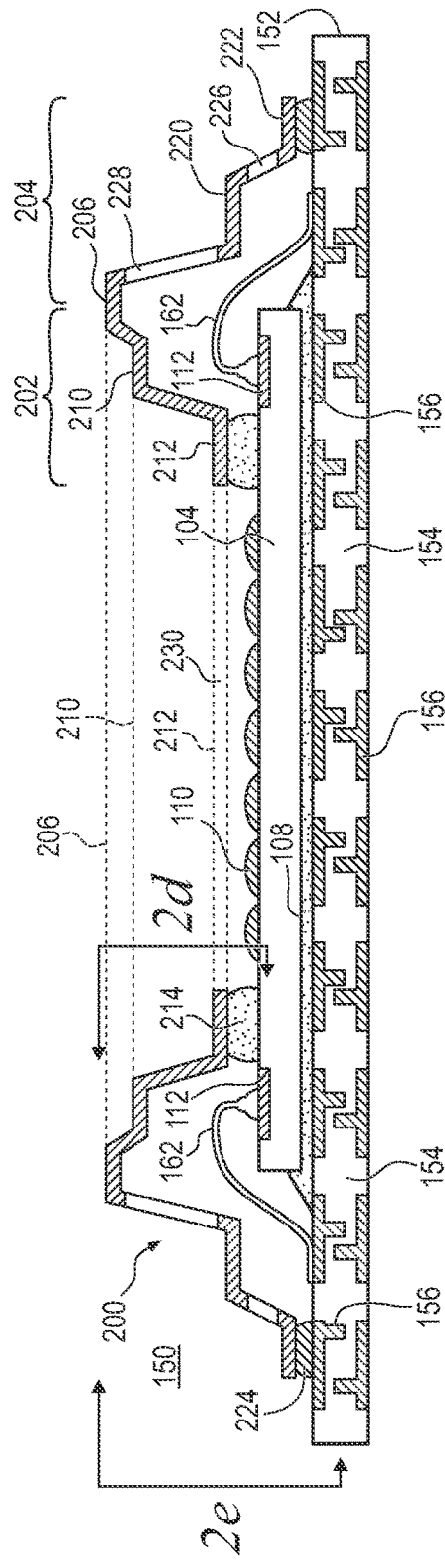
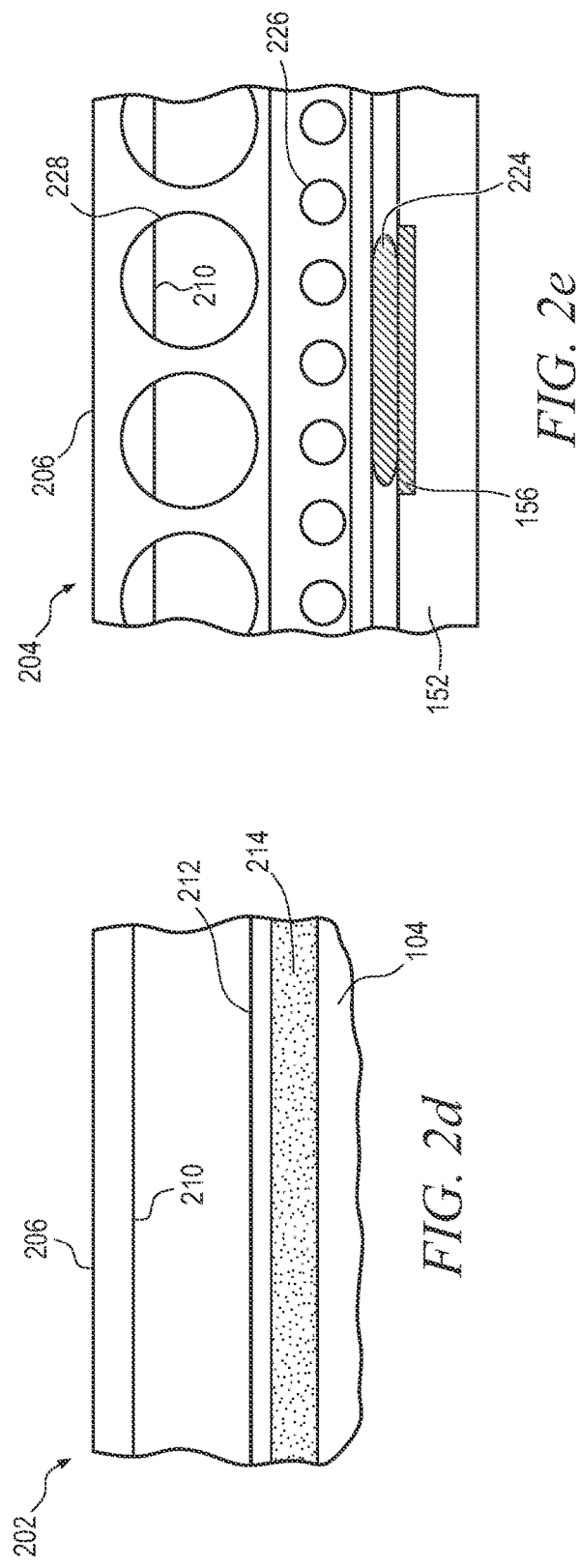

US 12,302,657 B2

SEMICONDUCTOR DEVICE AND METHOD OF FORMING AN OPTICAL SEMICONDUCTOR PACKAGE WITH A SHIELD STRUCTURE

CLAIM OF DOMESTIC PRIORITY

The present application claims the benefit of U.S. Provisional Application No. 63/194,375, filed May 28, 2021, which application is incorporated herein by reference.

FIELD OF THE INVENTION

The present invention relates in general to semiconductor devices and, more particularly, to a semiconductor device and method of forming an optical semiconductor package with a shield structure.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Optically sensitive semiconductor devices commonly have a lens or other optically transmissive lid or cover disposed over a photosensitive circuit on a semiconductor die. Packaging the semiconductor die typically includes depositing an encapsulant or molding compound around the semiconductor die while leaving the lens exposed. Preventing the lens from getting covered by encapsulant is important because the encapsulant can block light that is desired to travel through the lens.

Blocking encapsulant from over the lens is typically done by using transfer molding that applies pressure against the lens, which can cause problems such as cracking or moving the lens. The adhesive used to mount the lens can break under pressure from the mold, allowing the lens to fall away from the package or shift enough to cause malfunction of the end device. Even with the mold applying pressure against the lens, some encapsulant can still bleed onto the lens and block light.

Accordingly, there is a need for improvements in packaging methods and devices for optically sensitive integrated circuits.

BRIEF DESCRIPTION OF THE DRAWINGS

FIGS. 2a-2j illustrate a process of forming an optical semiconductor package with a shield structure;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
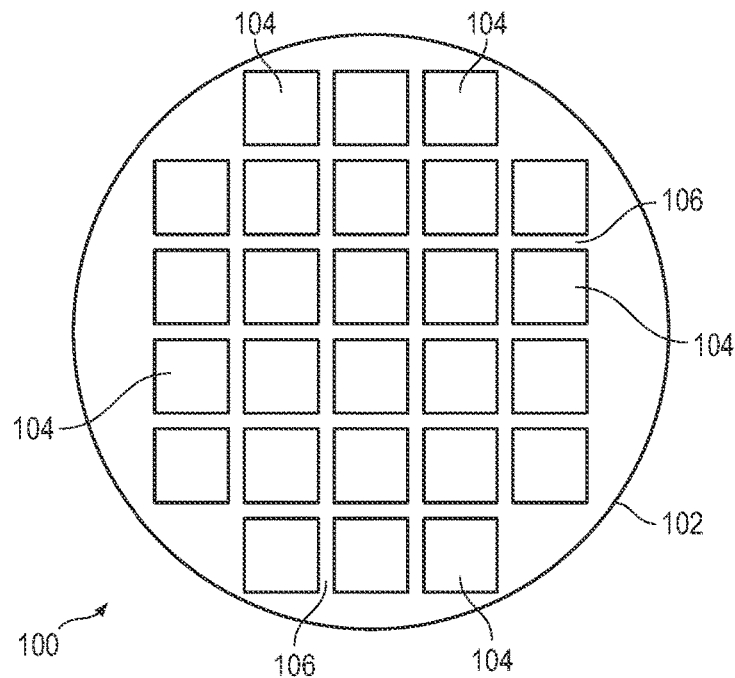
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
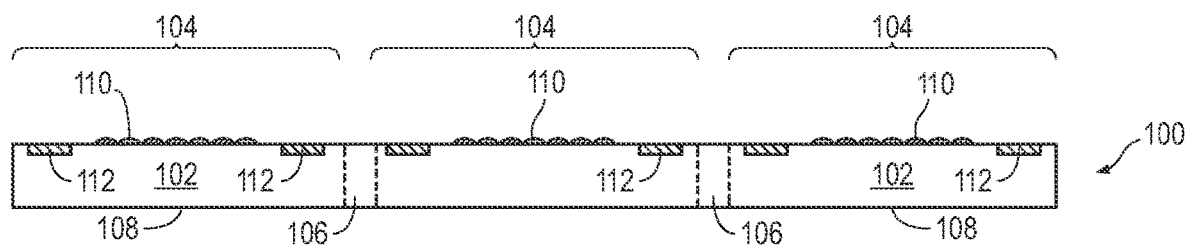

FIG. 1B shows a cross-sectional view of a portion of semiconductor wafer 100. Each semiconductor die 104 has a back or non-active surface 108 and an active surface including a photosensitive circuit 110 and additional analog or digital circuits implemented as active devices, passive devices, conductive layers, and dielectric layers formed within the die and electrically interconnected according to the electrical design and function of the die. For example, the circuit may include one or more transistors, diodes, sensors, and other circuit elements to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing. Semiconductor die 104 can implement a digital camera, luminescence sensor, or any other photosensitive device.

An electrically conductive layer 112 is formed over the active surface using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), platinum (Pt), or other suitable electrically conductive material. Conductive layer 112 operates as contact pads electrically connected to the circuits on the active surface.

Figure 1C:
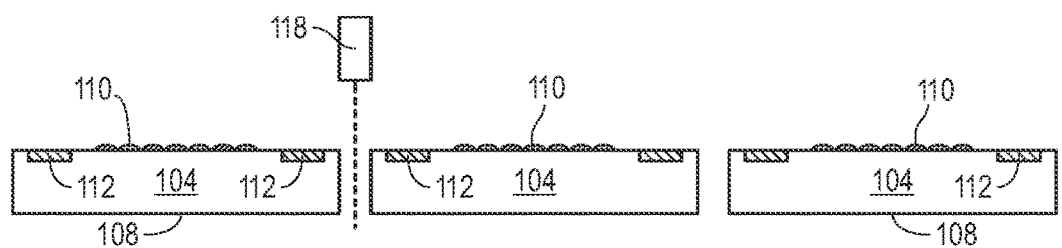

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post singulation.

Figure 2A:
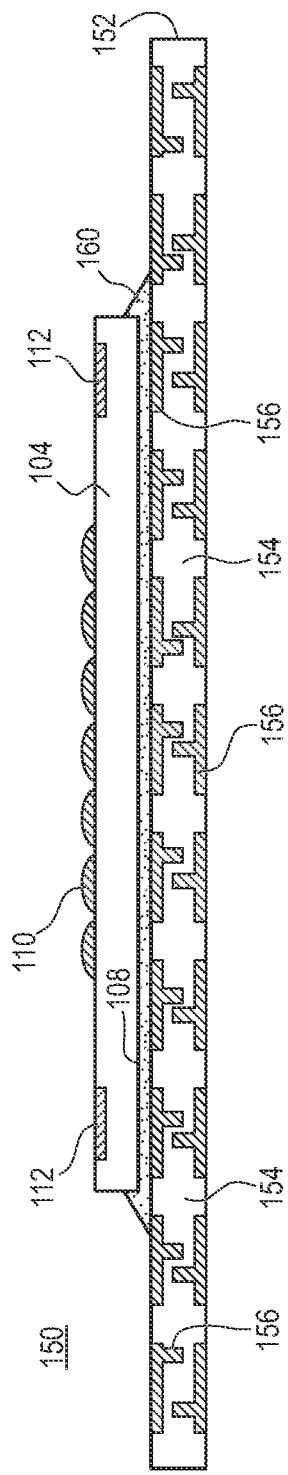

FIGS. 2a-2j illustrate a process of forming a semiconductor package 150 with semiconductor die 104. FIG. 2a shows a partial cross-sectional view of a substrate 152. While only a single substrate 152 is shown, hundreds or thousands of substrates are commonly processed on a common carrier, using the same steps described herein for a single unit but performed en masse. Substrate 152 could also start out as a single large substrate with multiple units being formed thereon, which are singulated from each other during or after the manufacturing process.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Substrate 152 in FIG. 2a has semiconductor die 104 mounted thereon, as well as any discrete active or passive components, other semiconductor die, or other components desired for the intended functionality of the package. Any type and number of components can be mounted on both the top and bottom surfaces of substrate 152, or embedded within the substrate.

Semiconductor die 104 is disposed on substrate 152 using a pick-and-place process, or another suitable process or device, with photosensitive circuit 110 and contact pads 112 oriented away from the substrate. A mold underfill or other adhesive 160 is disposed on back surface 108 or substrate 152 prior to mounting semiconductor die 104. Adhesive 160 keeps semiconductor die 104 in place during the manufacturing process.

Figure 2B:
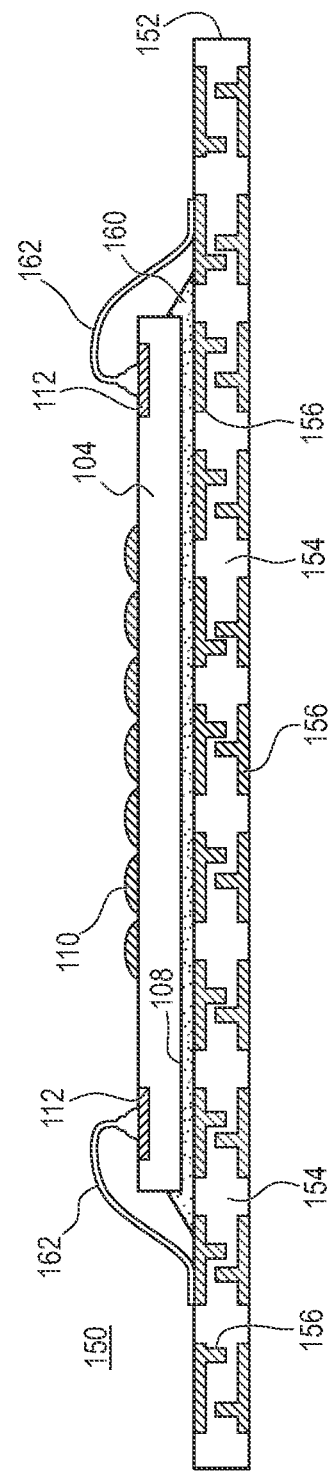

In FIG. 2b, a plurality of bond wires 162 is formed between contact pads 112 of semiconductor die 104 and contact pads of substrate 152. Bond wires 162 are mechanically and electrically coupled to conductive layer 156 of substrate 152 and to contact pads 112 of semiconductor die 104 by thermocompression bonding, ultrasonic bonding, wedge bonding, stitch bonding, ball bonding, or another suitable bonding technique. Bond wires 162 include a conductive material such as Cu, Al, Au, Ag, a metal alloy, or a combination thereof. Bond wires 162 represent one type of interconnect structure that electrically couples semiconductor die 104 to substrate 152. In other embodiments, solder bumps, conductive pillars, or another suitable interconnect structure is used. Semiconductor die 104 is a flip-chip die with photosensitive circuit 110 formed on the opposite surface from contact pads 112 in one embodiment.

FIG. 2c shows the mounting of a shield 200 onto semiconductor die 104 and substrate 152. Shield 200 has an inner portion, end, or section 202 and an outer portion, end, or section 204. Inner section 202 and outer section 204 meet at a peak or top 206. Inner section 202 includes a step 210 between foot 212 and top 206. Foot 212 is attached to semiconductor die 104 using an adhesive 214. Adhesive 214 is optionally conductive to improve grounding of semiconductor die 104 or shield 200.

Outer section 204 includes a step 220 and foot 222, similar to step 210 and foot 212 of inner section 202. Solder bumps 224 are disposed between foot 222 and conductive layer 156 to mechanically and electrically connect shield 200 to substrate 152. A conductive or non-conductive adhesive can be used instead of solder bumps 224 in other embodiments. Openings 226 are formed in shield 200 between step 220 and foot 222. Openings 228 are formed in shield 200 between step 220 and top 206.

Shield 200 extends completely around photosensitive area 110, having a substantially uniform shape in every cross-section. Openings 226 and 228 may not exist in all cross-sections, but typically feet 212 and 222, steps 210 and 220, and top 206 are formed uniformly. Shield 200 forms a square, rectangle, circle, or other desired shape in plan view. Dotted lines indicate where feet 212, step 210, and top 206 extend between the two illustrated portions of shield 200 in other cross-sections. Foot 212 and step 220 also extend between the two illustrated portions of shield 200 but are not represented by dotted lines in FIG. 2c. Shield 200 has an opening 230 in the middle over photosensitive circuit 110. Opening 230 completely encompasses photosensitive circuit 110 so that shield 200 does not overlap a footprint of the photosensitive circuit.

Shield 200 is formed from sheet metal in one embodiment. The metal can be aluminum, steel, gold, copper, combinations or alloys thereof, or another suitable material. The sheet metal is cut into the desired shape, including cutting openings 226, 228, and 230, by laser cutting, mechanical cutting, punching, or another suitable process. The sheet metal is then pressed or folded into the desired shape, including top 206, step 210, and step 220. In one embodiment, sheet metal is formed and punched in a single step to manufacture shield 200. In other embodiments, shield 200 is formed from molded polymer or another non-conductive material. Any suitable manufacturing process and material can be used to make shield 200.

FIG. 2d shows a view of inner section 202 from the interior of package 150. Adhesive 214 forms a continuous barrier all the way around the bottom of inner section 202, under foot 212. FIG. 2e shows a view of outer section 204 from outside of shield 200. Openings 226 and 228 can be any desired size and shape. Openings 228 can be smaller and formed in multiple rows. The bottom of step 210 can be seen through openings 228. Other details, such as semiconductor die 104 and bond wires 162, would be visible through openings 226 and 228 in reality but have been left off for simplicity of illustration. Bumps 224 are formed as a plurality of discrete bumps around the outer perimeter of shield 224, but could also be formed as a continuous bead as with adhesive 214. In one embodiment, foot 222 is formed as a plurality of discrete feet extending down from top 206 or step 220 only where needed to allow connection to substrate 152.

Figure 2F:
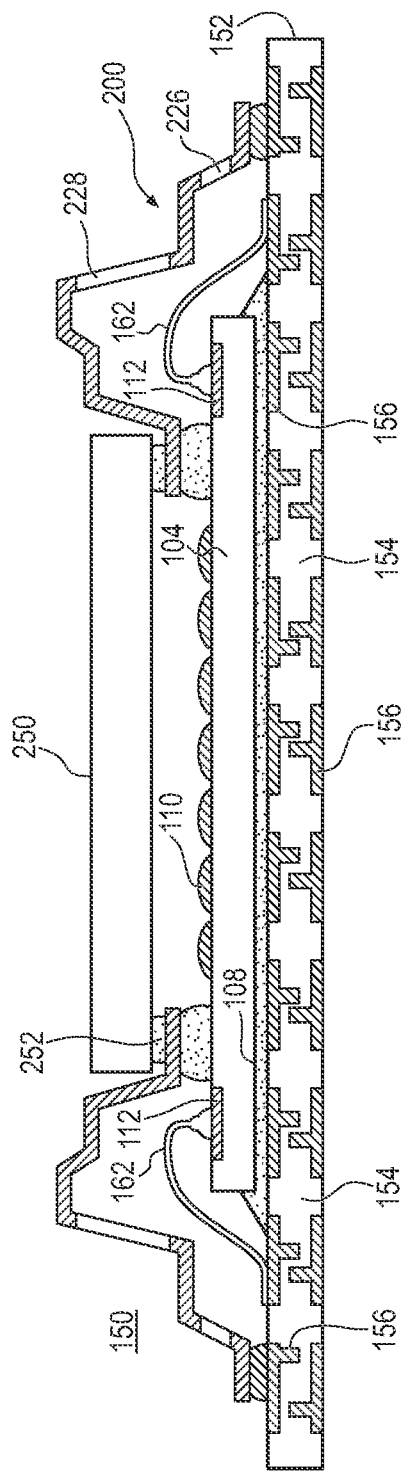

In FIG. 2f, lens 250 is disposed over photosensitive circuit 110. Lens 250 has light-transmissive properties to allow an optical signal from outside of package 150 to be detected by photosensitive circuit 110. Lens 250 is formed from glass or a light-transmissive polymer in some embodiments. Lens 250 can have any combination of convex, concave, curved, domed, Fresnel, or other shaped surfaces to guide or focus light as desired. Lens 250 may also be flat as illustrated and operate primarily to physically protect photosensitive circuit 110 without significantly modifying light transmitted through the lens. Lens 250 is mounted to the top of foot 212 using an adhesive 252. Adhesive 252 can either form a continuous bead all the way around lens 250 or be deposited as a plurality of discrete dots of adhesive. Adhesive 252 holds lens 250 in place over opening 230.

Figure 2G:
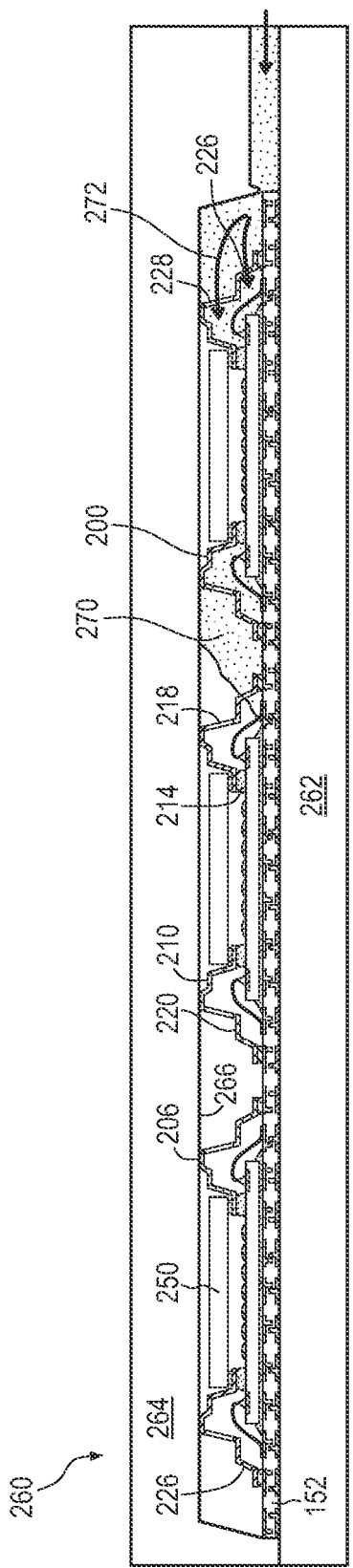

In FIG. 2g, package 150 is disposed into a chase mold 260, including a bottom chase 262 and top chase 264 for molding with encapsulant 270. Encapsulant 270 is an electrically insulating material deposited using a paste printing, compressive molding, transfer molding, liquid encapsulant molding, vacuum lamination, spin coating, or other suitable application process. Encapsulant 270 can be polymer composite material, such as an epoxy resin, epoxy acrylate, or polymer with or without a filler. Encapsulant 270 is non-conductive and environmentally protects the semiconductor device from external elements and contaminants.

A plurality of packages 150 is shown prior to singulating substrate 152 to separate the packages, which is commonly how the packages are manufactured. Substrate 152 sits on bottom chase 262. Top chase 264 closes down on top of packages 150, with surface 266 of the top chase pressing against top 206 of shields 200. Encapsulant 270 flows through openings 226 and 228 as illustrated by arrows 272 to fill the space under shields 200 with encapsulant. Encapsulant under shields 200 protects bond wires 162 and semiconductor die 104.

Figure 2H:
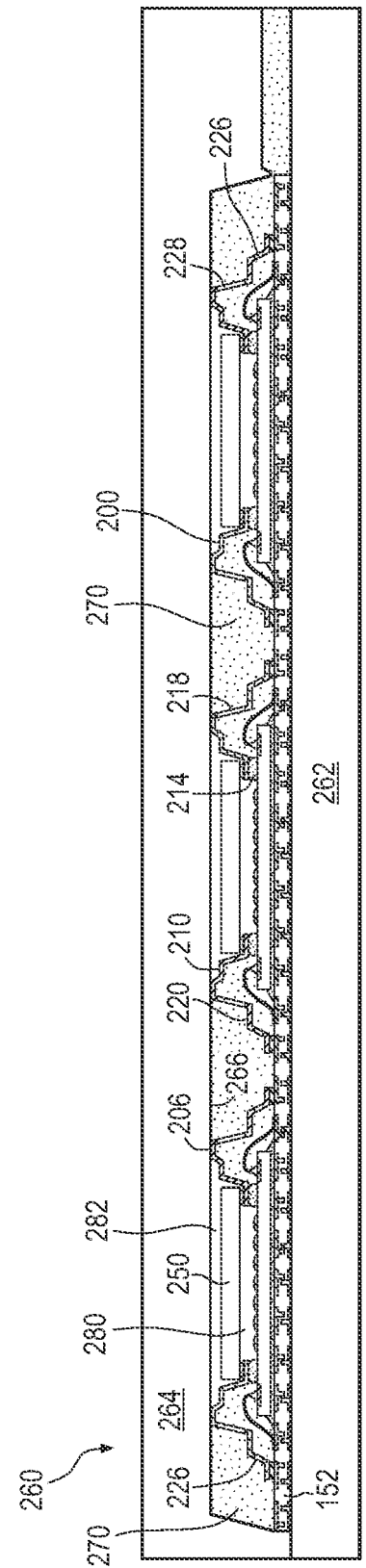

FIG. 2h shows chase mold 260 with encapsulant fully deposited. Without holes in inner section 202, encapsulant 170 does not flow to the interior of shield 200 where lens 250 is located. Top 206 of shield 200 presses against surface 266 all the way around lens 250 to form a seal at the top of the shield. Adhesive 214 forms a seal around the bottom of shield 200 between foot 212 and semiconductor die 104. The seals formed by top 206 pressing against surface 266 and by adhesive 214 protect lens 250 from being covered in encapsulant 270.

Two separate cavities 280 and 282 are kept free of encapsulant 270. Cavity 280 is between semiconductor die 104 and lens 250 and enclosed by adhesive 214 and adhesive 252. Photosensitive circuit 110 is located within cavity 280. Cavity 282 is over lens 250 and enclosed by adhesive 252 and physical contact with top chase 264.

Top chase 264 presses down on tops 206 of shields 200 to seal off cavities 282. The folds in inner section 202 and outer section 204, which form steps 210 and 220, operate as springs to allow shields 200 to flex under pressure from chase mold 260. Openings 226 and 228 also provide some additional spring action for shield 200. Providing flex in shields 200 reduces pressure on substrate 152 and semiconductor die 104, as the force of chase mold 260 is absorbed by the shields. Top chase 264 contacts shields 200 rather than lenses 250 as in the prior art, so the potential for damage to the lenses is greatly reduced. In addition, the springiness of shields 200 improves the seal at top 206. The physical separation between the seal of top 206 and lens 250 also reduces the potential for malfunction if some encapsulant does leak through the seal.

Figure 2I:
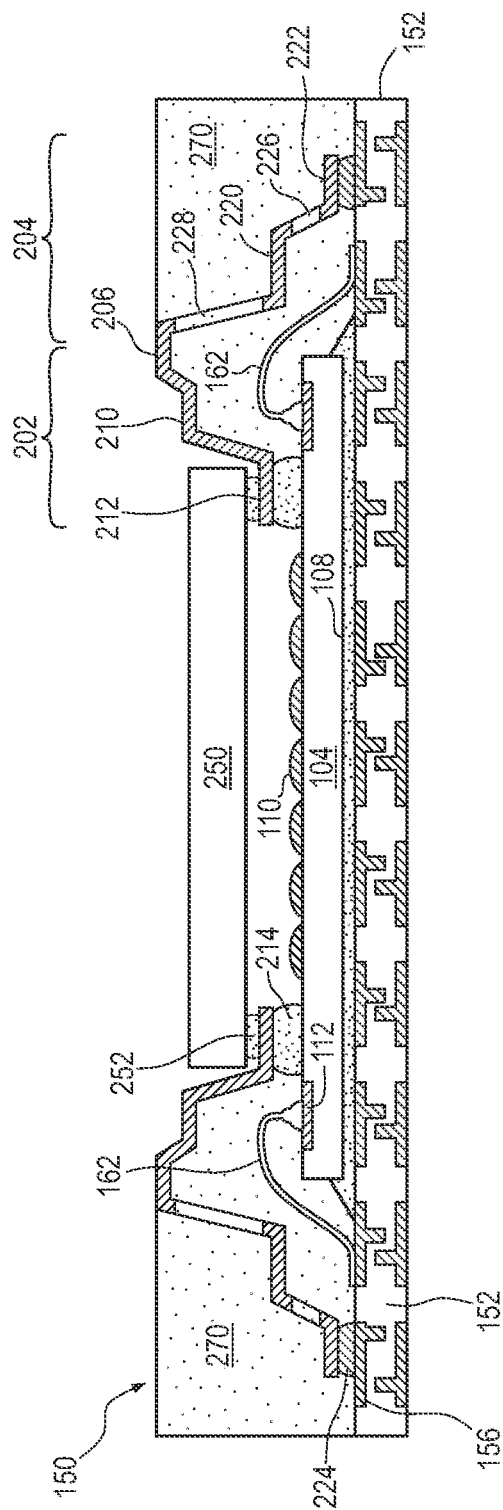

FIG. 2i shows a package 150 removed from chase mold 260. Openings 226 and 228 and the area under shield 200 are filled with encapsulant 270. Photosensitive circuit 110 remains exposed to optical stimulus from outside of package 150 through lens 250 even though semiconductor die 104 is fully protected by encapsulant 170. Holes 226 and 228 allow encapsulant 270 to fill the area under shield 200, physically covering and encapsulating bond wires 162 and semiconductor die 104. Top 206 of shield 200 is flush with the top of encapsulant 270 and package 150 as a whole due to top chase 264 pressing against the top of the shield. Photosensitive circuit 110 and lens 250 remain free from the encapsulant due to inner portion 220 blocking encapsulant flow to cavities 280 and 282. Lens 250 was protected from physical damage by depositing encapsulant 270 with top chase 264 contacting shield 200 instead of directly contacting lens 250.

In addition to the above-described benefits to the encapsulation process of shield 200, shield 200 also provides electromagnetic interference (EMI) shielding for semiconductor die 104 and also helps dissipate heat. When a transparent encapsulant 270 is used, inner section 202 of shield 200 blocks light and shields photosensitive circuit 110 from receiving reflections off of wire bonds 162 and other reflective components of package 150.

Figure 2J:
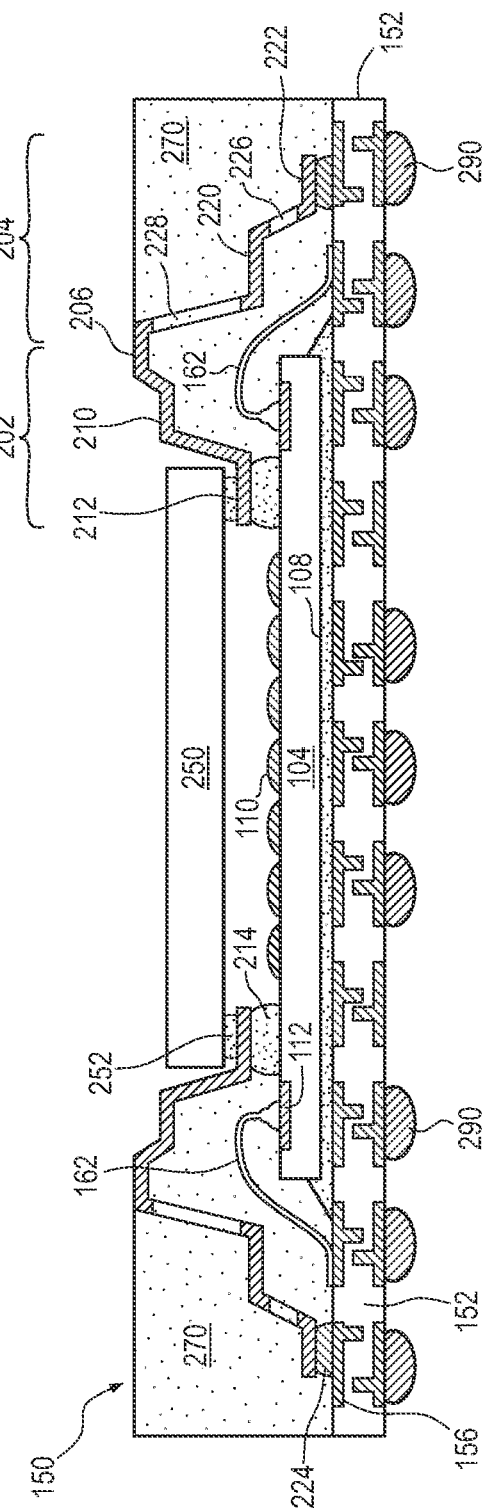

In FIG. 2j, an electrically conductive bump material is deposited over substrate 152 opposite semiconductor die 104 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to contact pads of conductive layer 156 using a suitable attachment or bonding process. The bump material can be reflowed by heating the material above its melting point to form conductive balls or bumps 290. In one embodiment, conductive bumps 290 are formed over an under-bump metallization (UBM) having a wetting layer, barrier layer, and adhesion layer. Conductive bumps 114 can also be compression bonded or thermocompression bonded to conductive layer 156.

Conductive bumps 290 represent one type of interconnect structure that can be formed over substrate 152 for electrical connection to a larger electrical system. The interconnect structure can also use bond wires, conductive paste, stud bump, micro bump, conductive pillars, or another type of electrical interconnect. Package 150 in FIG. 2j is a completed product, ready to be integrated into a larger electrical system or stored in a tape-and-reel for delivery to a customer. In some embodiments, packages 150 are singulated through encapsulant 270 and substrate 152 to separate a plurality of packages from a larger panel that were all manufactured together.

Figure 3:
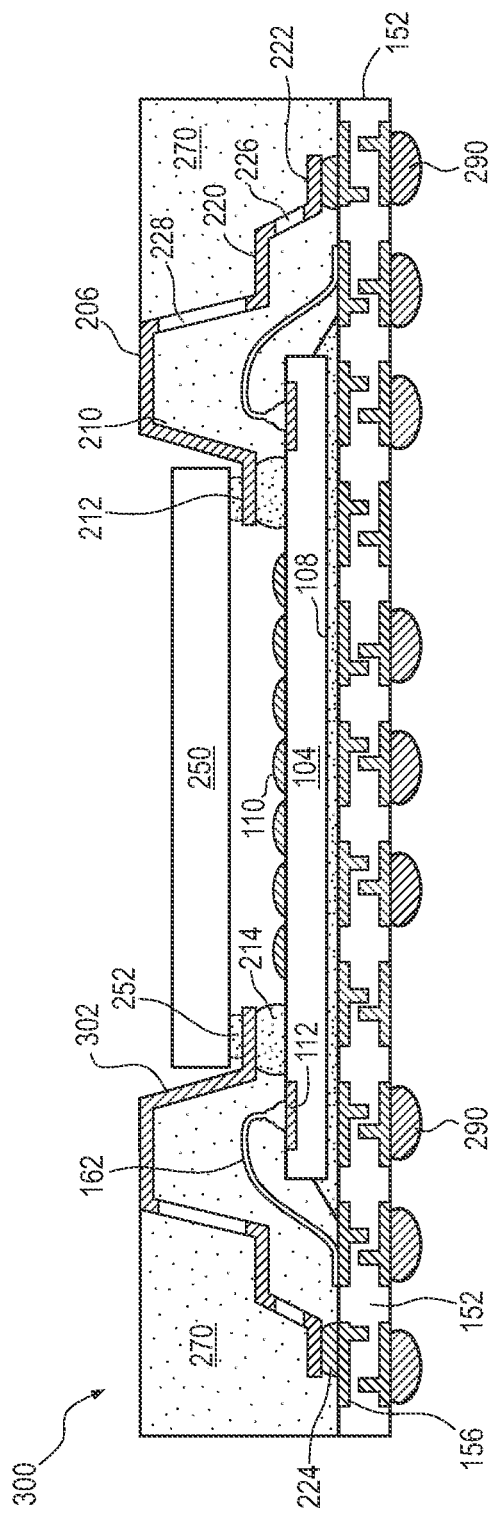
FIG. 3 illustrates a second shield structure embodiment.

FIG. 3 illustrates an alternative embodiment as package 300 with shield 200 having an inner section 202 with a straight leg 302. Inner portion 202 has no step 210 as in the first embodiment. The shield in FIG. 3 still has a spring effect due to step 220 of outer portion 204, as well as openings 226 and 228.

Figure 4:
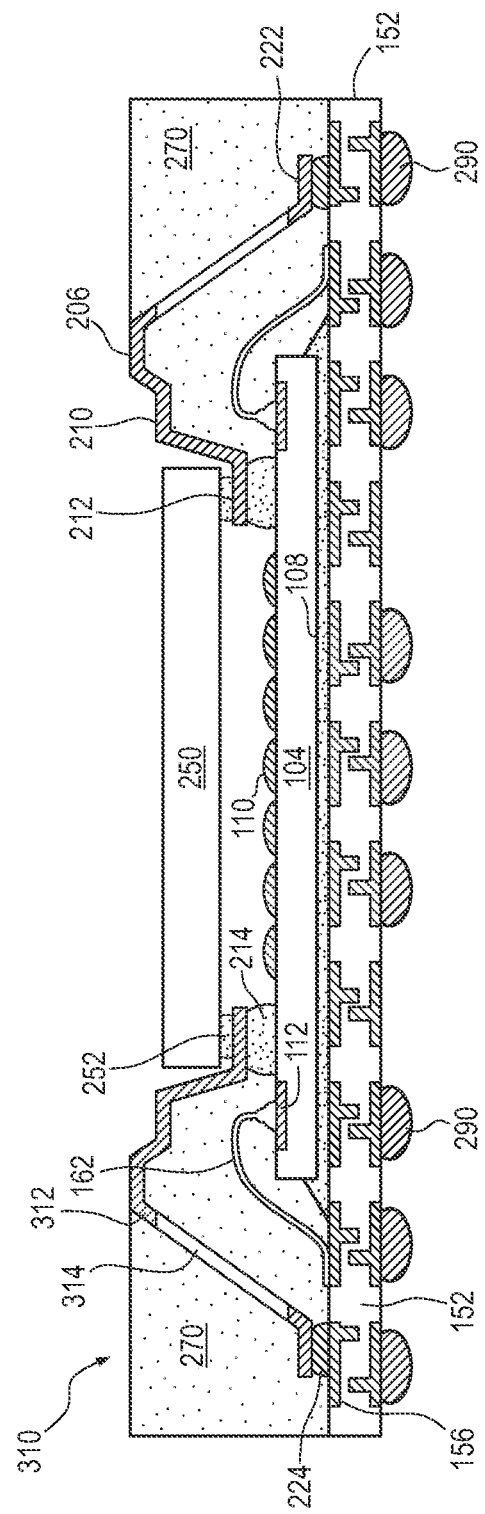
FIG. 4 illustrates a third shield structure embodiment.

FIG. 4 shows an alternative embodiment as package 310 with outer section 204 having a straight leg 312 and opening 314. The shield in FIG. 4 still provides a spring effect due to step 210 of inner section 204. Openings 314 of leg 312 also allow some flex to outer section 204.

Figure 5:
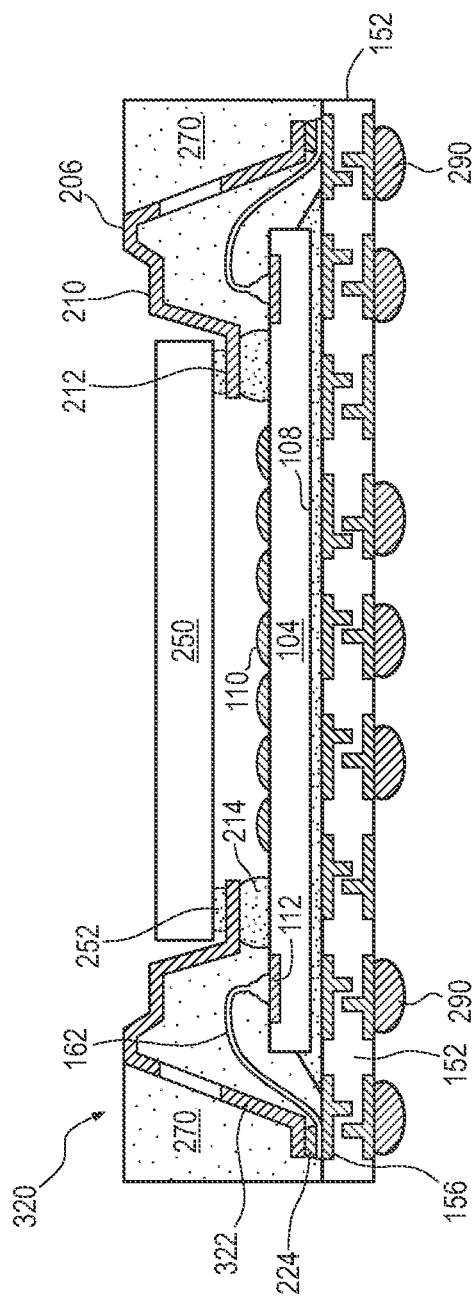
FIG. 5 illustrates a reduced shield structure and package footprint.

FIG. 5 shows an alternative embodiment as package 320 where shield 200 has a smaller footprint. Legs 322 are formed with reduced lateral extension to share a row of contact pads on substrate 152 with bond wires 162. Legs 322 are formed as a plurality of physically separate legs and share contact pads with some of the bond wires 162. Other bond wires 162 are coupled to contact pads between legs 322 so that not all bond wires are directly electrically coupled to shield 200.

Figure 6:
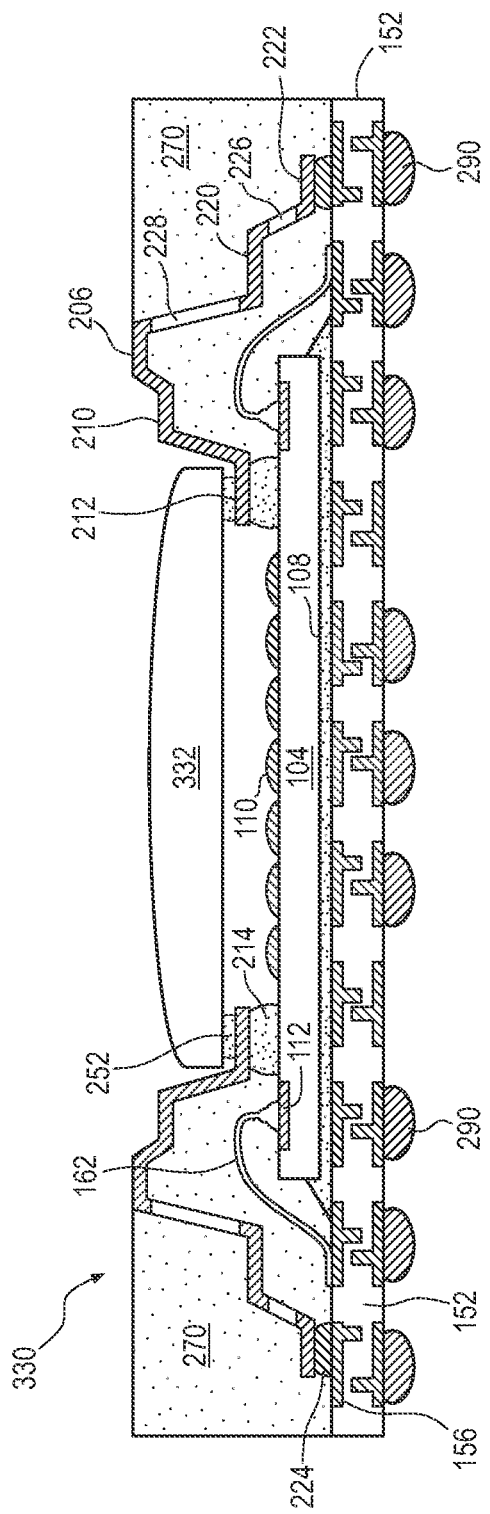
FIG. 6 illustrates an alternative lens shape.

FIG. 6 illustrates an embodiment as package 330 with a convex or domed lens 332. Lens 332 allows light to be focused onto photosensitive circuit 110.

Figure 7:
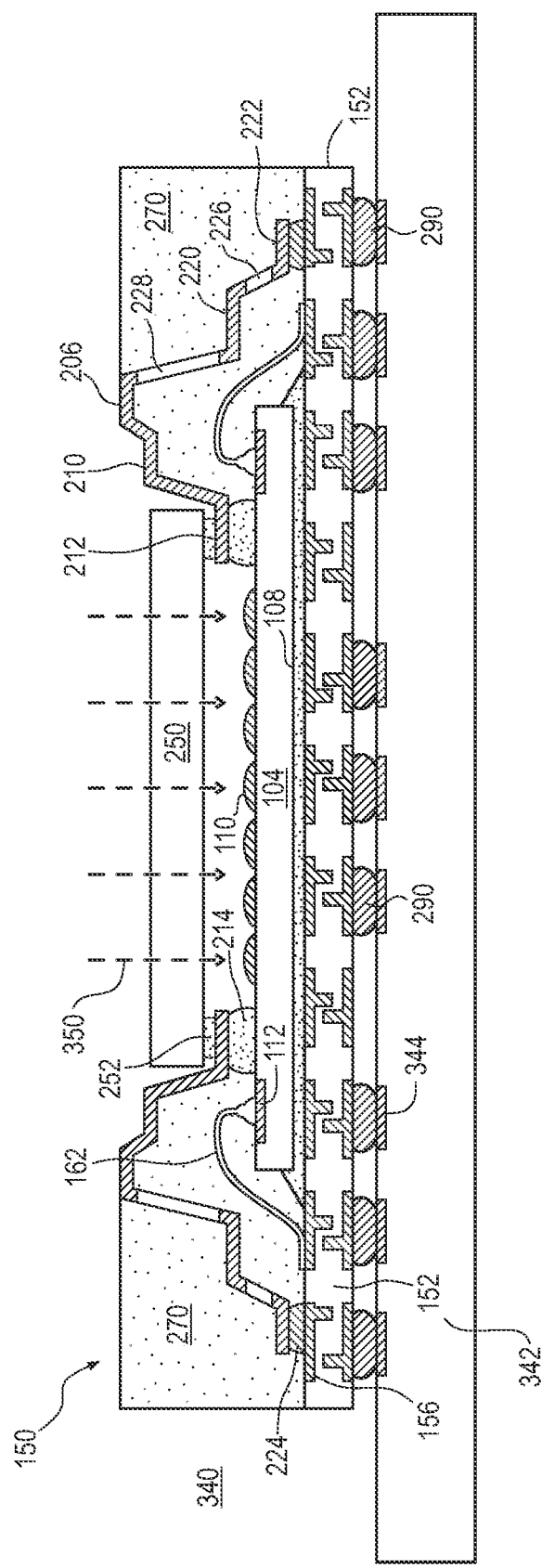
FIG. 7 illustrates incorporating the optically sensitive semiconductor package into a larger electronic device.

FIG. 7 illustrates integrating the above-described semiconductor packages, e.g., package 150, into a larger electronic device 340. FIG. 7 is a partial cross-section of package 150 mounted onto a printed circuit board (PCB) or other substrate 342 as part of electronic device 340. Bumps 290 are reflowed onto conductive layer 344 of PCB 342 to physically attach and electrically connect package 150 to the PCB. In other embodiments, thermocompression or other suitable attachment and connection methods are used. In some embodiments, an adhesive or underfill layer is used between package 150 and PCB 342. Semiconductor die 104 is electrically coupled to conductive layer 344 through substrate 152 to allow use of the functionality of package 150 to the larger system.

Electronic device 340 can have one type of semiconductor package, or multiple types of semiconductor packages, depending on the application. Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Package 150 can operate as, e.g., a camera or luminescence sensor for electronic device 340, converting light rays 350 into a sensor reading or photographic image.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a substrate;
a semiconductor die including a photosensitive circuit disposed over the substrate;
a shield disposed over the substrate and semiconductor die with a first opening of the shield disposed over the photosensitive circuit, wherein the shield includes a peak, an inner section oriented toward the semiconductor die relative to the peak, and an outer section oriented away from the semiconductor die relative to the peak, and wherein the outer section of the shield is attached to the substrate and includes a second opening formed through a sloped portion of the outer section;
a bead of adhesive extending around the photosensitive circuit between the shield and semiconductor die; and
an encapsulant deposited over the substrate and semiconductor die, wherein the encapsulant extends into the second opening and a first area between the shield and substrate while the bead of adhesive seals a gap between the shield and semiconductor die so that a second area over the photosensitive circuit remains devoid of the encapsulant.

2. The semiconductor device of claim 1, further including a lens disposed on the shield over the first opening.

3. The semiconductor device of claim 2, wherein a height of the shield over the substrate is greater than a distance from the substrate to a top of the lens.

4. The semiconductor device of claim 2, wherein the inner section of the shield provides physical separation between the lens and the encapsulant.

5. The semiconductor device of claim 1, further including a bond wire coupled between the semiconductor die and a contact pad of the substrate.

6. The semiconductor device of claim 5, wherein the shield is coupled to the contact pad of the substrate.

7. A semiconductor device, comprising:
a substrate;
a semiconductor die including a photosensitive circuit disposed over the substrate; and
a shield disposed over the substrate and semiconductor die with a first opening of the shield disposed over the photosensitive circuit, wherein the shield includes a peak, an inner section oriented toward the semiconductor die relative to the peak, and an outer section oriented away from the semiconductor die relative to the peak, and wherein the outer section of the shield includes a second opening.

8. The semiconductor device of claim 7, further including a lens disposed on the shield over the first opening.

9. The semiconductor device of claim 8, wherein the lens includes a curved surface.

10. The semiconductor device of claim 7, further including a step formed in the outer section or the inner section of the shield.

11. The semiconductor device of claim 7, further including a mold plate physically contacting a top of the shield around the photosensitive circuit.

12. The semiconductor device of claim 11, further including an encapsulant deposited into the mold, wherein the encapsulant extends into the second opening.

13. The semiconductor device of claim 12, further including a bead of adhesive extending around the photosensitive circuit between the shield and semiconductor die, wherein the encapsulant extends to the bead of adhesive.

14. A method of making a semiconductor device, comprising:
providing a substrate;
disposing a semiconductor die including a photosensitive circuit over the substrate;
disposing a shield over the substrate and semiconductor die with a first opening of the shield disposed over the photosensitive circuit, wherein the shield includes a peak, an inner section oriented toward the semiconductor die relative to the peak, and an outer section oriented away from the semiconductor die relative to the peak, and wherein the outer section of the shield includes a second opening; and
depositing an encapsulant over the substrate and semiconductor die, wherein the encapsulant flows through the second opening to fill an area between the shield and the substrate.

15. The method of claim 14, wherein the inner section of the shield blocks encapsulant from covering the photosensitive circuit while depositing the encapsulant.

16. The method of claim 14, further including disposing a lens over the first opening.

17. The method of claim 14, further including disposing the substrate, semiconductor die, and shield into a mold, wherein the mold physically contacts a top of the shield.

18. The method of claim 17, further including applying pressure to the top of the shield with the mold, wherein the shield compresses to absorb a portion of the pressure.

19. The method of claim 14, wherein the outer section of the shield includes a step.

20. The method of claim 14, wherein the inner section of the shield includes a step.

* * * * *